United States Patent
Li et al.

(10) Patent No.: US 11,101,443 B2
(45) Date of Patent: Aug. 24, 2021

(54) ORGANIC ELECTROLUMINESCENCE DISPLAY PANEL, MANUFACTURING METHOD THEREFOR, AND DISPLAY DEVICE

(71) Applicant: BOE Technology Group Co., Ltd., Beijing (CN)

(72) Inventors: Wei Li, Beijing (CN); Xing Zhang, Beijing (CN); Fengjuan Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/616,768

(22) PCT Filed: Mar. 15, 2019

(86) PCT No.: PCT/CN2019/078361
§ 371 (c)(1),
(2) Date: Nov. 25, 2019

(87) PCT Pub. No.: WO2019/179371
PCT Pub. Date: Sep. 26, 2019

(65) Prior Publication Data
US 2020/0106039 A1    Apr. 2, 2020

(30) Foreign Application Priority Data
Mar. 23, 2018    (CN) .......................... 201810247665.0

(51) Int. Cl.
*H01L 51/50*    (2006.01)
*H01L 27/32*    (2006.01)
(Continued)

(52) U.S. Cl.
CPC ........ *H01L 51/5044* (2013.01); *H01L 27/322* (2013.01); *H01L 51/5228* (2013.01); *H01L 51/56* (2013.01)

(58) Field of Classification Search
CPC ............. H01L 51/5044; H01L 51/5228; H01L 27/322; H01L 51/56; H01L 27/3246;
(Continued)

(56) References Cited

U.S. PATENT DOCUMENTS

2016/0181566 A1    6/2016 Wang
2016/0349565 A1    12/2016 Kim et al.
(Continued)

FOREIGN PATENT DOCUMENTS

CN    203259749 U    10/2013
CN    103972270 A    8/2014
(Continued)

OTHER PUBLICATIONS

Office Action for corresponding Chinese Application No. 201810247665.0 dated Aug. 1, 2019.
(Continued)

*Primary Examiner* — Thanh Y. Tran
(74) *Attorney, Agent, or Firm* — Arent Fox LLP; Michael Fainberg

(57) ABSTRACT

Disclosed are an organic electroluminescence display panel, a manufacturing method therefor, and a display device. The organic electroluminescence display panel comprises an array substrate and an opposite substrate which are disposed opposite to each other; the opposite substrate comprises a first base substrate and multiple spacers located on the first base substrate, and the array substrate comprises a second base substrate, multiple sub pixels located on the second base substrate, a pixel defining layer for defining regions of the sub pixels, and elastomers located on the pixel defining (Continued)

layer and having one-to-one correspondence to at least part of the spacers in terms of position; the elastomers are compressed by the corresponding spacers during cell aligning to buffer the pressure applied to the array substrate.

13 Claims, 2 Drawing Sheets

(51) Int. Cl.
*H01L 51/52* (2006.01)
*H01L 51/56* (2006.01)

(58) Field of Classification Search
CPC ............... H01L 51/525; H01L 51/5246; H01L 27/3279; H01L 2251/5315
See application file for complete search history.

(56) References Cited

U.S. PATENT DOCUMENTS

| | | |
|---|---|---|
| 2017/0003538 A1 | 1/2017 | Wang et al. |
| 2018/0088736 A1* | 3/2018 | Jeong .................. G06F 3/04144 |
| 2018/0286934 A1 | 10/2018 | Zhao |
| 2020/0106039 A1 | 4/2020 | Li et al. |

FOREIGN PATENT DOCUMENTS

| | | |
|---|---|---|
| CN | 104635384 A | 5/2015 |
| CN | 106920828 A | 7/2017 |
| CN | 108461527 A | 8/2018 |

OTHER PUBLICATIONS

Office Action for corresponding Chinese Application No. 201810247665.0 dated Dec. 19, 2019.

* cited by examiner

ORGANIC ELECTROLUMINESCENCE DISPLAY PANEL, MANUFACTURING METHOD THEREFOR, AND DISPLAY DEVICE

CROSS REFERENCE TO RELATED APPLICATIONS

This application is a US National Stage of International Application No. PCT/CN2019/078361, filed Mar. 15, 2019, which claims priority to China Patent Application No. 201810247665.0, filed with the Chinese Patent Office on Mar. 23, 2018 and entitled "Organic Light-Emitting Diode Display Panel and Manufacturing Method Thereof, and Display Device", which is hereby incorporated by reference in its entirety.

FIELD

The present disclosure relates to the technical field of displaying, and particularly to an OLED display and a manufacturing method thereof, and a display device.

BACKGROUND

At present, an organic light-emitting diode display panel (OLED) has emerged in the field of flat computer displaying due to its characteristics of thinness, low consumption, high response and high resolution, and has potential market prospects that are favored by the industry. According to light-emitting directions, the OLED can be classified as a bottom emitting OLED display panel and a top emitting OLED display panel. The top emitting OLED can effectively solve the problems of reduction of the aperture ratio and reduction of the brightness of a display panel due to a complicated structural compensation circuit.

In a process of cell-aligning an opposite substrate (i.e., a cover plate) and an array substrate (i.e., a back plate) of the top emitting OLED display panel, spacers of the opposite substrate are in contact with and press against the surface of the array substrate, which will cause film layers in the array substrate to be crushed and mainly a cathode to be crushed, so that water and oxygen invade and make a light-emitting layer fail, thereby leading to poor luminescence of the display panel and generating black spots on the display panel.

SUMMARY

The present disclosure provides an organic light-emitting diode display panel (OLED), which includes: a first base substrate; a plurality of spacers on the first base substrate; a second base substrate opposite to a side of the first base substrate provided with the spacers; a pixel defining layer on a surface of the second base substrate facing the first base substrate; and a plurality of elastomers on the pixel defining layer and in one-to-one correspondence to positions of at least part of the spacers, where the elastomers are configured to be compressed by the corresponding spacers in a cell-aligning process of the first base substrate and the second base substrate to buffer pressure applied to layers on the second base substrate.

In one possible implementation, in the OLED display panel according to an embodiment of the present disclosure, the elastomers have inverted trapezoidal cross sections in a direction from the second base substrate to the first base substrate before the elastomers are compressed by the corresponding spacers. The OLED display panel further includes: a cathode layer on a layer where the elastomers are located and cut off by the elastomers.

In one possible implementation, the OLED display panel according to an embodiment of the present disclosure further includes: an auxiliary cathode between the spacer and the first base substrate, and a contact electrode covering the spacer. The auxiliary cathode is connected with a portion of the cathode layer around the elastomer through the contact electrode.

In one possible implementation, in the OLED display panel according to an embodiment of the present disclosure, a material of the spacers is a rigid material.

In one possible implementation, in the OLED display panel according to an embodiment of the present disclosure, orthographic projections of the auxiliary cathode and the contact electrode on the second base substrate are both covered by an orthographic projection of the pixel defining layer on the base second substrate.

In one possible implementation, the OLED display panel according to an embodiment of the present disclosure further includes: a light-emitting functional layer between the layer where the elastomers are located and the cathode layer, wherein the light-emitting functional layer is disposed on a whole surface and cut off by the elastomers; and a color filter layer and a black matrix between the spacers and the first base substrate.

In one possible implementation, in the OLED display panel according to an embodiment of the present disclosure, the elastomers on the pixel defining layer are in one-to-one correspondence to positions of all the spacers.

In one possible implementation, in the OLED display panel according to an embodiment of the present disclosure, an orthographic projection of a surface of the spacer facing the elastomer on the second base substrate covers an orthographic projection of a surface of the elastomer facing the spacer on the second base substrate.

In one possible implementation, in the OLED display panel according to an embodiment of the present disclosure, the elastomer and the corresponding spacer are on a same central axis.

In one possible implementation, in the OLED display panel according to an embodiment of the present disclosure, a material of the elastomers is one or any combination of polystyrene, polyphenylene ethylene, ethylene propylene diene monomer rubber and polyurethane elastomer rubber.

In one possible implementation, in the OLED display panel according to an embodiment of the present disclosure, the elastomers are 1 to 2 μm in thickness in a direction perpendicular to the second base substrate.

The present disclosure further provides a display device, including any one of the above OLED display panel.

The present disclosure further provides a manufacturing method of any one of the above OLED display panel. The method includes: providing a first base substrate and a second base substrate; forming a plurality of spacers on the first base substrate; forming a pixel defining layer for defining a subpixel region on the second base substrate; forming elastomers which are in one-to-one correspondence to the positions of at least part of the spacers on the pixel defining layer; and cell-aligning the first base substrate and the second base substrate such that at least part of the spacers compress the corresponding elastomers.

In one possible implementation, in the manufacturing method according to the embodiment of the present disclosure, forming elastomers which are in one-to-one correspondence to the positions of at least part of the spacers on the pixel defining layer includes: coating a layer of photocurable high-elasticity material on a layer where the pixel defining layer is located, and patterning the layer of photocurable high-elasticity material by prebaking, exposure, developing and postbaking processes to form the elastomers which are in one-to-one correspondence to the positions of at least part of the spacers.

DETAILED DESCRIPTION

Figure 1:
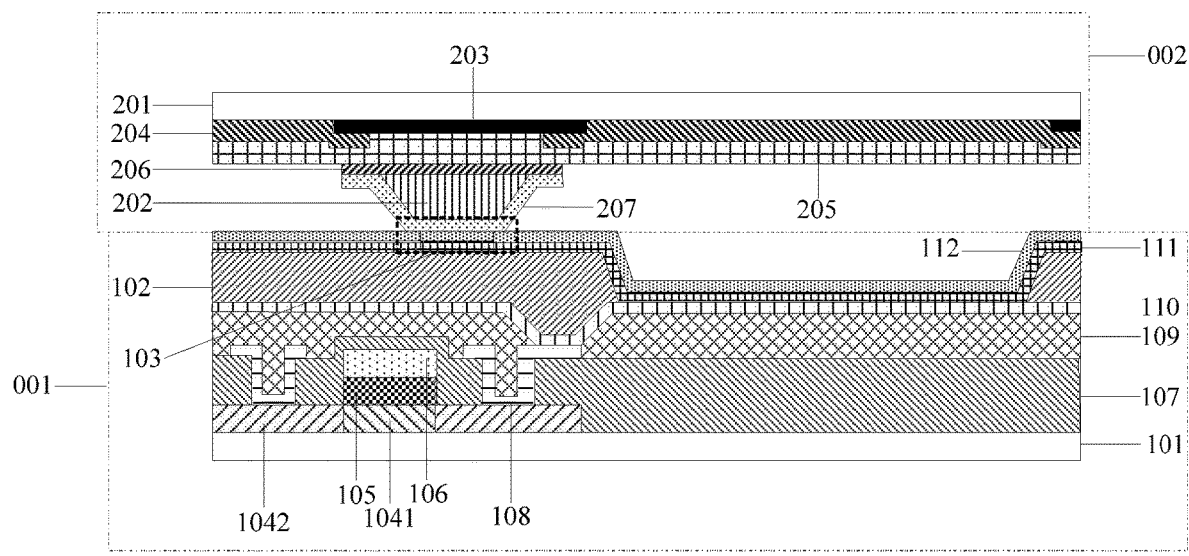
FIG. 1 is a schematic structural diagram of an OLED display panel according to an embodiment of the present disclosure.

The implementations of an OLED display panel and a manufacturing method thereof, and a display device according to the embodiments of the present disclosure are described in detail below in conjunction with the accompanying drawings. It should be noted that the embodiments described in this description are only part of the embodiments of the present disclosure, but not all the embodiments. Moreover, in the case of no conflict, the embodiments in this application and the features in the embodiments may be combined with each other. In addition, all other embodiments obtained by those of ordinary skill in the art based on the embodiments of the present disclosure without creative work shall fall within the protection scope of the present disclosure.

The shapes and sizes of various film layers in the drawings are not representative of real scales in an OLED, and are only to illustrate the content of the present disclosure.

An embodiment of the present disclosure provides an OLED display panel, as shown in FIG. 1, which includes: a first base substrate 201; a plurality of spacers 202, wherein the spacers 202 are on the first base substrate 201; a second base substrate 101, wherein the second base substrate 101 is opposite to the side of the first base substrate 201 provided with the spacers 202; a pixel defining layer 102, wherein the pixel defining layer 102 is located on the surface of the second base substrate 101 facing the first base substrate 201; and a plurality of elastomers 103, wherein the elastomers 103 are located on the pixel defining layer 102 and in one-to-one correspondence to the positions of at least part of the spacers 202. The elastomers 103 are configured to be compressed by the corresponding spacers 202 in a process of cell-aligning the first substrate 201 and the second substrate 101, to buffer pressure applied to film layers on the second substrate 101.

Specifically, in the OLED display panel according to the embodiment of the present disclosure, the first base substrate 201 and various components on the first base substrate 201 constitute an opposite substrate 002 or a cover plate. When the components of the opposite substrate 002 include a color filter layer, the opposite substrate 002 is also a color filter substrate. The second base substrate 101 and various components on the second base substrate 101 constitute an array substrate 001 or a back plate.

Specifically, in the OLED display panel according to the embodiment of the present disclosure, the elastomers 103 are configured to be compressed by the corresponding spacers 202 in a cell-aligning process to buffer pressure applied to the array substrate 001. Since the elastomers 103 disposed on the pixel defining layer 102 may be freely compressed by the corresponding spacers 202 in the cell-aligning process, the pressure applied to the array substrate 001 is effectively buffered, thereby avoiding the film layers in the array substrate 001 from being crushed and then preventing water and oxygen invasion, ensuring the stable performance of a light-emitting layer, and improving the light-emitting yield of the display panel.

Optionally, in order to better buffer the pressure applied to the array substrate 001 in the cell-aligning process, in the OLED display panel according to the present disclosure, elastomers 103 one-to-one corresponding the positions of all the spacers 202 are arranged on the pixel defining layer 102. Of course, corresponding elastomers 103 may be arranged at the positions of part of the spacers 202, which is not limited herein. FIG. 1 merely illustrates one elastomer 103 and one corresponding spacer 202.

Figure 2:
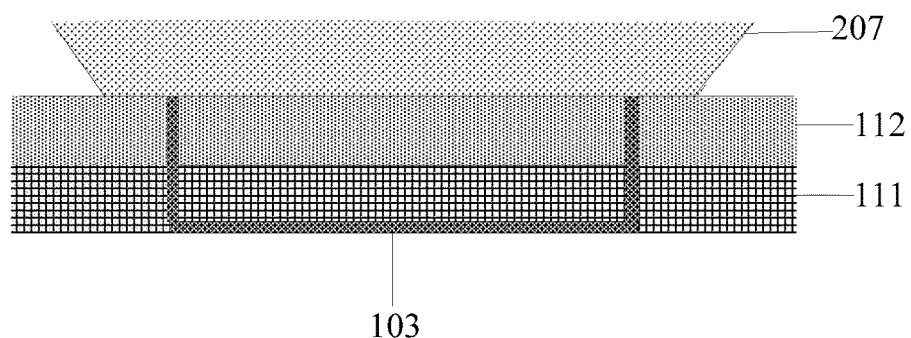
FIG. 2 is an enlarged view of a thick dotted box portion in FIG. 1.
Figure 3:
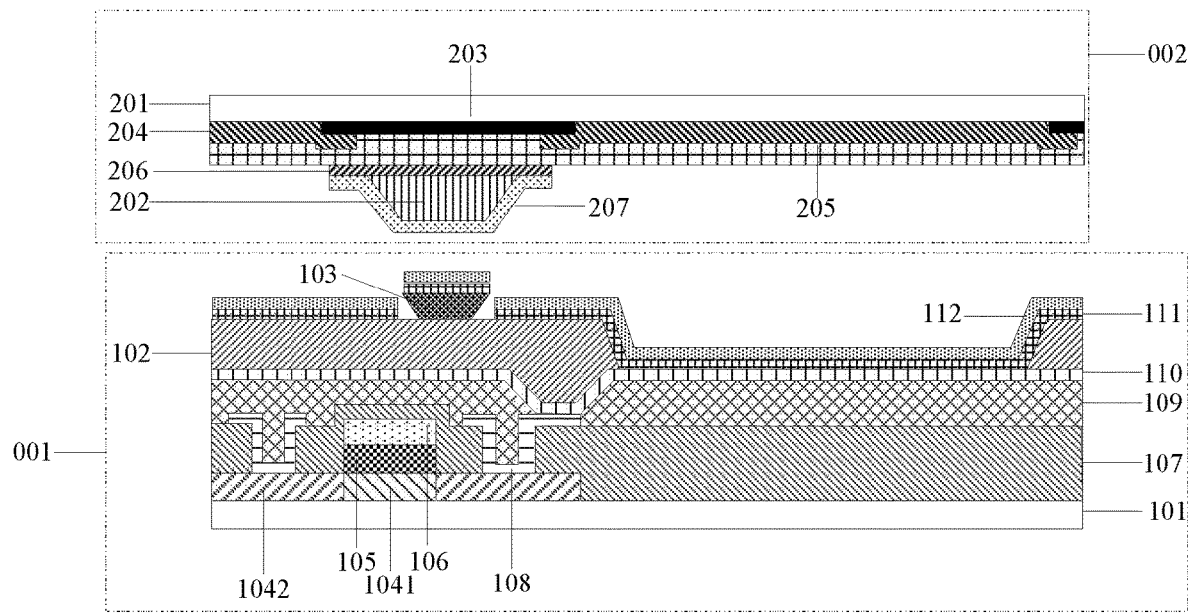
FIG. 3 is a schematic structural diagram of an OLED display panel according to an embodiment of the present disclosure before cell-aligning.

Optionally, in the OLED display panel according to the embodiment of the present disclosure, the elastomer 103 may be of various shapes before being compressed. For example, as shown in FIG. 3, the cross-sectional shape of the elastomer 103 in a direction from the second substrate 101 to the first substrate 201 is an inverted trapezoid that is wide at the upper part and narrow at the lower part. Correspondingly, the OLED display panel further includes: a cathode layer 112 located on the layer where the elastomer 103 is located and cut off by the elastomer 103. Furthermore, a light-emitting functional layer 111 is also arranged between the layer of the elastomer 103 and the cathode layer 112. The inverted trapezoidal elastomer 103 is directly formed on the pixel defining layer 102, and then the light-emitting functional layer 111 and the cathode layer 112 are sequentially formed, and the portions of the light-emitting functional layer 111 and the cathode layer 112 located above the elastomer 103 may be cut off from other positions. In this way, even if the portions of the light-emitting functional layer 111 and the cathode layer 112 located above the elastomer 103 are crushed due to being subjected to pressure in the cell-aligning process, the operation of other portions of the light-emitting functional layer 111 and the cathode layer 112 is not affected. Moreover, the inverted trapezoidal elastomer 103 may fill gaps of the light-emitting functional layer 111 and the cathode layer 112 after being compressed by the spacer 202 and deforming (as shown in FIG. 2), thereby avoiding the failure of the light-emitting functional layer 111 due to the invasion of the water and oxygen through the gaps.

Optionally, in the OLED display panel according to the embodiment of the present disclosure, the elastomer 103 is generally 1 to 2 μm in thickness in a direction perpendicular to the second base substrate 101, to ensure that the light-emitting functional layer 111 and the cathode layer 112 can be cut off.

Optionally, in the OLED display panel according to the embodiment of the present disclosure, a material of the elastomer 103 is one or any combination of polystyrene, polyphenylene ethylene (PPE), ethylene propylene diene momomer rubber and polyurethane elastomer rubber, and of course, may also be other highly elastic materials known to those skilled in the art. It is not limited herein.

It can be understood that a three-dimensional structure of the inverted trapezoidal elastomer 103 may be a cone frustum that has upper and lower circular bottom surfaces, may also be a prism frustum that has upper and lower quadrangular bottom surfaces, or other components having structures that are wide at the upper parts and narrow at the lower parts.

Optionally, in the OLED display panel according to the embodiment of the present disclosure, as shown in FIGS. 1 and 3, when the light-emitting functional layer 111 located between the film layer of the elastomer 103 and the cathode layer 112 is arranged on the whole surface, that is, when the light-emitting functional layer 111 emits white light, a color filter layer 204 and a black matrix 203 are further disposed between the spacer 202 and the first substrate 201 in order to realize the color of each subpixel, and a second planarization layer 205 is disposed between and the spacer 202 and the film layer where the color filter layer 204 and the black matrix 203 are located. In this way, the cathode layer 112 is generally made of a transparent conductive oxide material, so that the light-emitting functional layer 111 of each subpixel may emit white light. When the light-emitting functional layer 111 of each subpixel is made of a material with different light-emitting colors, the cathode layer 112 is generally made of a metal material to form a micro-cavity structure.

Optionally, in the OLED display panel according to the embodiment of the present disclosure, in order to increase the transmittance of light in the top emitting type OLED display panel, the cathode layer 112 needs to be made of a thin transparent conductive material, for example, an indium zinc oxide (IZO) material. The thin transparent cathode layer 112 has extremely high impedance, and a large voltage drop may occur when current flows through the cathode layer 112, thereby affecting the uniformity of brightness of the OLED display panel. In order to solve the above problem, as shown in FIG. 1, an auxiliary cathode 206 having low resistance may be disposed between the spacer 202 and the first substrate 201, and a contact electrode 207 that covers the spacer 202 and is connected with the auxiliary cathode 206 is provided. The auxiliary cathode 206 is connected with a portion of the cathode layer 112 located around the elastomer 103 through the contact electrode 207, thereby achieving lowering the resistance of the cathode layer 112.

In order to ensure that the contact electrode 207 and the auxiliary cathode 206 do not affect the transmittance, orthographic projections of the auxiliary cathode 206 and the contact electrode 207 on the second base substrate 201 may be both covered by an orthographic projection of the pixel defining layer 102 on the second base substrate 201.

In order to ensure that the auxiliary cathode 206 has relatively low resistance, the auxiliary cathode 206 is generally made of metal. In order to ensure that the contact electrode 207 has a continuous slope pattern on the spacer 202, the contact electrode 207 is generally made of a transparent metal oxide such as indium tin oxide (ITO).

In order to facilitate the contact electrode 207 to contact with the portion of the cathode layer 112 around the elastomer 103, in the OLED display panel according to the embodiment of the present disclosure, an orthographic projection of the surface of the spacer 202 facing the elastomer 103 on the second base substrate 101 covers an orthographic projection of the surface of the elastomer 103 facing the spacer 202 on the second base substrate 101.

Moreover, in order to ensure uniform stress on the cathode layer 112 in the cell-aligning process, the elastomer 103 and the corresponding spacer 202 may be located on the same central axis. For example, if the three-dimensional structures of the spacer 202 and the elastomer 103 are both cone frustums, the diameter of the circular bottom surface of the spacer 202 facing the elastomer 103 may be greater than the diameter of the circular bottom surface of the elastomer 103 facing the spacer 202, and the centers of the two circles coincide.

Because the material of the spacer 202 is generally an elastic material in the related art, and the material of the elastomer 103 according to the embodiment of the present disclosure is also an elastic material, when the spacer 202 compresses the elastomer 103 in the cell-aligning process, the spacer 202 itself may also undergo a certain deformation, which causes the contact electrode 207 covering the spacer 202 to deform or even be broken. In order to avoid breakage of the contact electrode 207, the material of the spacer 202 in the OLED display panel according to the present disclosure is a rigid material. The rigid material may achieve the rigidity by selectively adding a benzene ring or a cage material into a photosensitive material.

Figure 4:
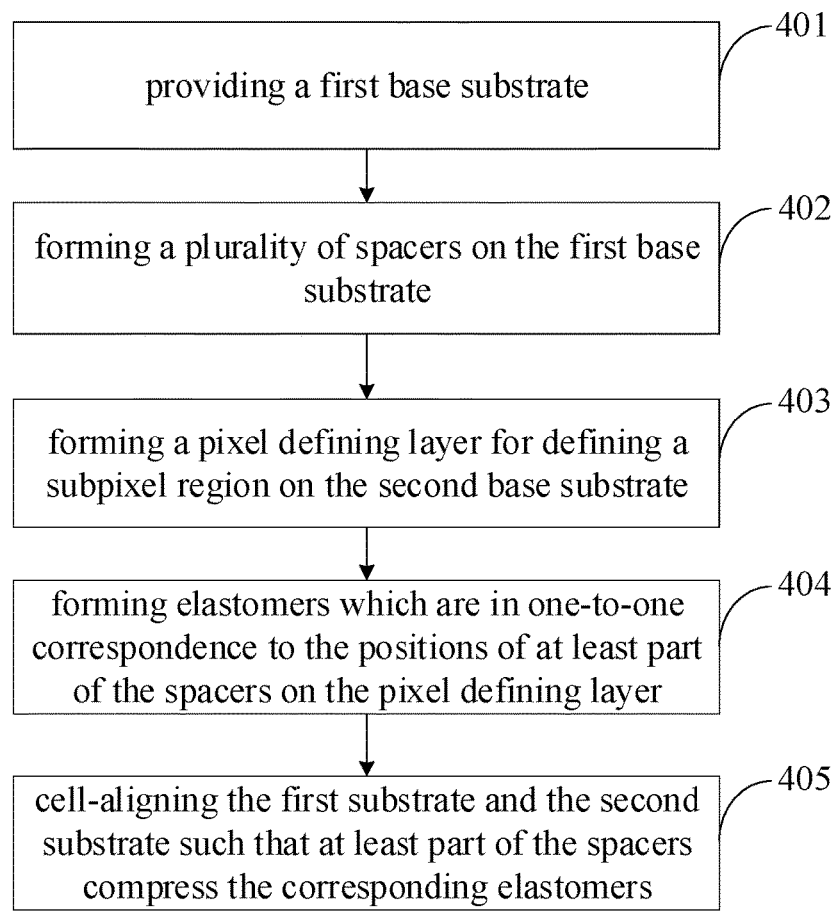
FIG. 4 is a flow chart of a manufacturing method of an OLED display panel according to an embodiment of the present disclosure.

Correspondingly, an embodiment of the present disclosure further provides a manufacturing method of an OLED display panel. As shown in FIG. 4, the method specifically includes the following steps.

S401 is to provide a first base substrate and a second base substrate.

S402 is to form a plurality of spacers on the first base substrate.

S403 is to form a pixel defining layer for defining a subpixel region on the base second substrate.

S404 is to form elastomers, which are in one-to-one correspondence to the positions of at least part of the spacers, on the pixel defining layer.

S405 is to cell-align the first base substrate and the second base substrate such that at least part of the spacers compress the corresponding elastomers.

The step S404 that the elastomers, which are in one-to-one correspondence to the positions of at least part of the spacers, are formed on the pixel defining layer may be specifically implemented by the following mode: a layer of photocurable high-elasticity material is coated on the layer where the pixel defining layer, and the elastomers which are in one-to-one correspondence to the positions of at least part of the spacers are formed by patterning by means of pre-baking, exposure, developing and postbaking processes.

It should be noted that in the above manufacturing method according to the embodiment of the present disclosure, the patterning process involved in formation of all film layer structures may include not only part or all of processes such as deposition, photoresist coating, masking with a mask, exposure, development, etching and photoresist stripping, but also other processes, which are specifically determined by a pattern required to be patterned formed during actual manufacturing, and are not limited herein. For example, a postbaking process may also be included after the development and before the etching.

The deposition process may be a chemical vapor deposition, a plasma enhanced chemical vapor deposition or a physical vapor deposition, which is not limited herein. A mask used in the masking process may be a halftone mask, a single slit mask or a gray tone mask, which is not limited herein. The etching may be dry etching or wet etching, which is not limited herein.

The manufacturing method of an OLED display panel according to the embodiment of the present disclosure is described in detail below by a specific example. Specific steps of manufacturing the OLED display panel are as follows.

The OLED display panel manufactured by the present disclosure is divided into an array substrate 001 portion and an opposite substrate 002 portion, and the two portions are manufactured separately and then are cell-aligned and encapsulated.

The process of manufacturing the array substrate 001 is as follows.

a) The second base substrate 101 is cleaned by a common standard method in the art.

b) An active layer 1041, conductor active layers 1042 located on two sides of the active layer 1041, a gate insulating layer 105, a gate 106, an interlayer dielectric layer 107, a source/drain 108, a first planarization layer 109 and an anode 110 are sequentially formed on the cleaned second base substrate 101 by patterning.

c) A layer of photocurable material is coated on the layer where the anode 110 is located is coated in a spin coating manner, and the processes such as prebaking, exposure, development and postbaking are sequentially performed on the photocurable material for patterning to obtain the pixel defining layer 102 with a thickness of 1.6 to 2.0 μm.

d) A layer of photocurable high-elasticity material is coated on the layer where the pixel defining layer 102 is located in the spin coating manner, and the processes such as prebaking, exposure, development and postbaking are sequentially performed on the photocurable high-elasticity material for patterning to prepare the elastomers 103 with inverted trapezoidal cross sections (such as cone frustums), wherein the inverted trapezoidal elastomers 103 are 1.0 to 2.0 μm in height.

e) A light-emitting functional layer 111 is formed by the evaporation on the pixel defining layer 102 on which the inverted trapezoids are formed.

f) A cathode layer 112 is formed on the light-emitting functional layer 111 by the sputtering, where a material of the cathode layer 112 may be indium zinc oxide (IZO).

Therefore, the array substrate 001 is manufactured. Furthermore, in the subsequent cell-aligning process, the spacers 202 may compress the elastomers 103 such that the pressure applied to the array substrate 001 is effectively buffered, which prevents the cathode layer 112 from being crushed, thereby preventing water and oxygen invasion, ensuring the stable performance of the light-emitting layer, and improving the light-emitting yield of the display panel.

The process of manufacturing the opposite substrate 002 is as follows.

a) The second base substrate 201 is cleaned by the common standard method in the art.

b) A black matrix 203 is formed on the cleaned first base substrate 201.

c) A Color Filter (CF) material is coated by the slit coating on the first base substrate 201 on which the black matrix 203 is formed, and then is patterned through the processes, such as prebaking, exposure, development and postbaking, to obtain a color filter layer 204 with a thickness of 2.0 μm.

d) A second planarization layer 205 with a thickness of about 2.5 μm is formed on the color filter layer 204 by the spin coating.

e) A pattern of an auxiliary cathode 206 is formed on the second planarization layer 205, wherein an orthographic projection of a black matrix 203 on the first base substrate 201 covers an orthographic projection of the auxiliary cathode 206 on the first base substrate 201. Specifically, the auxiliary cathode 206 is a stacked structure formed by molybdenum/aluminum neodymium/molybdenum (Mo/AlNd/Mo); furthermore, the first layer of molybdenum deposited on the second planarization layer 205 by a sputtering process is 400 Å in thickness, the aluminum neodymium on the first layer of molybdenum is 3000 Å in thickness, and the second layer of molybdenum on the aluminum neodymium is 800 Å in thickness.

f) A rigid material is coated on the auxiliary cathode 206 in a spin coating manner, and prebaking, exposure, development and postbaking are sequentially performed on the rigid material for patterning to obtain spacers 202, wherein each spacer 202 is a cone frustum, also known as a "truncated cone", which is 3.5 to 4.5 μm in height. In order to facilitate the contact of a contact electrode 207 covering the spacers 202 with the cathode 112 in the array substrate 001 after subsequent cell-aligning, to reduce the resistance of the cathode 112, the diameter of the circular surface of the cone frustum-shaped spacer 202 away from the first base substrate 201 is greater than the diameter of the circular surface of the cone frustum-shaped elastomer 103 away from the second base substrate 101.

g) An ITO material with a thickness of 1350 Å is deposited on the sides of the spacers 202 away from the first base substrate 201 in a sputtering manner, then the photoresist is coated on the ITO, and the processes of patterning, wet etching and photoresist stripping are sequentially performed to obtain the contact electrode 207, wherein the contact electrode 207 covers the surfaces of the spacers 202 and is connected with the auxiliary cathode 206.

Therefore, the opposite substrate 002 is manufactured. The manufactured array substrate 001 and opposite substrate 002 are cell-aligned and encapsulated to obtain an OLED display panel of a top emitting structure.

Based on the same inventive idea, an embodiment of the present disclosure further provides a display device, including the above OLED display panel according to the embodiment of the present disclosure. The display device may be: any product or component having a display function, such as a mobile phone, a tablet computer, a television, a display, a notebook computer, a digital camera, a navigator, a smart watch, a fitness wristband, a personal digital assistant and an automatic teller machine. Other indispensable components of the display device are all understood by those skilled in the art, and are not described herein and should not be construed as limiting the present disclosure. The implementation of the display device may refer to the embodiment of the above OLED, and repeated descriptions are omitted.

It should be noted that in this context, relational terms such as first and second are used merely to distinguish one entity or operation from another entity or operation, instead of necessarily requiring or implying that these entities or operations have any of these actual relationships or orders.

Obviously, those skilled in the art can make various modifications and variations to the present disclosure without departing from the spirit and scope of the present disclosure. Thus the disclosure is also intended to encompass these modifications and variations thereto so long as the modifications and variations fall into the scope of the claims appended to the disclosure and their equivalents.

The invention claimed is:

1. An Organic Light-Emitting Diode (OLED) display panel, comprising:
   a first base substrate;
   a plurality of spacers on the first base substrate;
   a second base substrate opposite to a side of the first base substrate provided with the spacers;
   a pixel defining layer on a surface of the second base substrate facing the first base substrate; and
   a plurality of elastomers on the pixel defining layer and in one-to-one correspondence to positions of at least part of the spacers, wherein the elastomers are configured to be compressed by the corresponding spacers in a cell-aligning process of the first base substrate and the second base substrate to buffer pressure applied to layers on the second base substrate;

wherein the elastomers have inverted trapezoidal cross sections in a direction from the second base substrate to the first base substrate before the elastomers are compressed by the corresponding spacers; and the OLED display panel further comprises: a cathode layer on a layer where the elastomers are located and cut off by the elastomers.

2. The OLED display panel according to claim 1, further comprising: auxiliary cathodes between the spacers and the first base substrate, and contact electrodes covering the spacers, wherein the auxiliary cathodes are in one-to-one correspondence with the spacers, and the contact electrodes are in one-to-one correspondence with the spacers; and the auxiliary cathodes are connected with a portion of the cathode layer around the elastomers through the contact electrodes.

3. The OLED display panel according to claim 2, wherein a material of the spacers is a rigid material.

4. The OLED display panel according to claim 2, wherein orthographic projections of the auxiliary cathodes and the contact electrodes on the second base substrate are both covered by an orthographic projection of the pixel defining layer on the second base substrate.

5. The OLED display panel according to claim 1, further comprising:

a light-emitting functional layer between the layer where the elastomers are located and the cathode layer, wherein the light-emitting functional layer is disposed on a whole surface and cut off by the elastomers; and a color filter layer and a black matrix between the spacers and the first base substrate.

6. The OLED display panel according to claim 1, wherein the elastomers on the pixel defining layer are in one-to-one correspondence to positions of all the spacers.

7. The OLED display panel according to claim 1, wherein an orthographic projection of a surface of each of the spacers facing a respective one of the elastomers on the second base substrate covers an orthographic projection of a surface of the respective one elastomer facing the each spacer on the second base substrate.

8. The OLED display panel according to claim 7, wherein the respective one elastomer and the each spacer are on a same central axis.

9. The OLED display panel according to claim 1, wherein a material of the elastomers is one or any combination of polystyrene, polyphenylene ethylene, ethylene propylene diene monomer rubber and polyurethane elastomer rubber.

10. The OLED display panel according to claim 1, wherein the elastomers are 1 to 2 μm in thickness in a direction perpendicular to the second base substrate.

11. A display device, comprising the OLED display panel according to claim 1.

12. A manufacturing method of the OLED display panel according to claim 1, comprising:

providing the first base substrate and the second base substrate;

forming the plurality of spacers on the first base substrate;

forming the pixel defining layer on the second base substrate;

forming elastomers which are in one-to-one correspondence to positions of at least part of the spacers on the pixel defining layer; and cell-aligning the first base substrate and the second base substrate such that at least part of the spacers compress the corresponding elastomers.

13. The manufacturing method according to claim 12, wherein forming elastomers which are in one-to-one correspondence to the positions of at least part of the spacers on the pixel defining layer comprises:

coating a layer of photocurable high-elasticity material on a layer where the pixel defining layer is located, and patterning the layer of photocurable high-elasticity material by prebaking, exposure, developing and postbaking processes to form the elastomers which are in one-to-one correspondence to the positions of at least part of the spacers.

* * * * *